(12) United States Patent
Atrey

(10) Patent No.: US 7,191,601 B2
(45) Date of Patent: Mar. 20, 2007

(54) MAGNETIC FIELD GENERATING ASSEMBLY

(75) Inventor: Milind Diwakar Atrey, Oxon (GB)

(73) Assignee: Oxford Instruments Superconductivity Ltd, Oxon (GB)

( * ) Notice: Subject to any disclaimer, the term of this patent is extended or adjusted under 35 U.S.C. 154(b) by 340 days.

(21) Appl. No.: 10/960,280

(22) Filed: Oct. 8, 2004

(65) Prior Publication Data

US 2005/0262851 A1    Dec. 1, 2005

(30) Foreign Application Priority Data

Jan. 28, 2004    (GB)    ................................... 0401835

(51) Int. Cl.
*F25B 19/00* (2006.01)
*F25B 9/00* (2006.01)

(52) U.S. Cl. .............................................. 62/6; 62/51.1

(58) Field of Classification Search .................. 62/6, 62/259.2, 51.1

See application file for complete search history.

(56) References Cited

U.S. PATENT DOCUMENTS 5,485,730 A * 1/1996 Herd ........................... 62/51.1
5,513,498 A * 5/1996 Ackermann et al. ......... 62/51.1
6,415,613 B1 * 7/2002 Ackermann et al. ......... 62/51.1
6,629,418 B1    10/2003 Gao et al.
6,640,552 B1 * 11/2003 Rampersad et al. ............. 62/6
6,727,699 B2 * 4/2004 Kasten ........................ 324/318

FOREIGN PATENT DOCUMENTS

WO    WO 03/023433 A1    3/2003

OTHER PUBLICATIONS

P.S. Thompson et al., "A Two-Stage Pulse Tube Cryo-Cooled MRI Magnet", AIP Conference Proceedings AIP USA, No. 613A, 2002, pp. 649-653, XP008036029.

* cited by examiner

*Primary Examiner*—William C. Doerrler

(57) ABSTRACT

A magnetic field generating assembly comprises a superconducting magnet located in a cryostat defining a bore accessible from outside the cryostat, and a mechanical refrigerator having at least two cooling stages for at least partly cooling the cryostat. A coolant path extends from the refrigerator into the magnet bore. The coolant path is coupled for heat exchange with a cooling stage of the refrigerator other than the coldest cooling stage, so that the refrigerator is adapted also to cool coolant in the coolant path.

18 Claims, 3 Drawing Sheets

MAGNETIC FIELD GENERATING ASSEMBLY

The invention relates to a magnetic field generating assembly comprising a superconducting magnet located in a cryostat and defining a bore accessible from outside the cryostat. Such assemblies are used in a wide variety of applications including NMR, MRI and FTICR. The invention is also applicable to other measurement devices requiring low temperatures such as those for material characterisation.

Typical cryostats include a number of radiation heat shields together with a coolant, such as liquid helium, within which the superconducting magnet is located. A sample or components such as RF and/or gradient coils are located in the bore, typically at room temperature, and in the case of components may be permanently mounted within the bore or mounted on a removable probe. In order to increase the signal to noise ratio and the like, there is a common requirement to cool these components and/or the sample and this has conventionally been achieved by coupling these components to a coolant path connected to a separate cooling system. An example of a cryocooler designed for an MRI probe is described in "A single-stage pulse tube cryocooler for horizontally cooling HTS MRI probe", Wang et al, paper presented at CEC-ICMC, Sept. 22–26, 2003, Anchorage, Ak., USA. Alternatively, the components could be located within the cryostat (but cooled by a separate coolant path) as described in WO 03/023433. However, this is not always possible since it is difficult to change the components once they are located in the cryostat. Furthermore, in the system described in WO 03/023433 it will not always be possible to obtain sufficient cooling power.

There is a need to simplify the known systems so as to reduce cost and complexity.

In accordance with the present invention, a magnetic field generating assembly comprises a superconducting magnet located in a cryostat and defining a bore accessible from outside the cryostat; and a mechanical refrigerator having at least two cooling stages for at least partly cooling the cryostat; and a coolant path extending from the refrigerator into the magnet bore, the coolant path being coupled for heat exchange with a cooling stage of the refrigerator other than the coldest cooling stage so that the refrigerator is adapted also to cool coolant in the coolant path.

With this invention it is possible to obtain sufficient cooling power from the same refrigerator, typically a cryocooler, for both cooling the cryostat and the coolant path leading to the bore which is nominally at room temperature. This not only reduces the cost and increase the reliability of the overall system, since one cryocooler and one compressor can be used instead of two of each, but does not require significant changes to be made to the refrigerator construction which is particularly advantageous. This is achieved by not using the coldest cooling stage (as in WO 03/023433). It has been realised that in WO 03/023433 the cooling effect obtained from the coldest stage at 4.2 K cannot be more than 1 W out of which at least a part of the cooling effect would be utilised for recondensation of the helium gas from the cryostat. The remaining cooling effect is not enough to cool extra circuit gas in the coolant path to 4 K and also the cooling effect available for the probe would be now less than 0.5 watts only which is not sufficient. The cooling effect requirement for a NMR probe is around 2–5 W at around 20–25 K. In order to make this possible the cooling effect has to be drawn from an intermediate stage only and not the coldest stage.

In some cases, the coolant path is used to cool components which are permanently mounted in the bore including RF and/or gradient coils.

In other cases, the coolant path can be used to cool components and/or a sample mounted on a probe which is insertable into and removable from the bore. In that case, at least part of the coolant path is preferably formed from a flexible conduit.

The number of stages will depend on the temperature requirement for the bore. If the shield temperature and the coil temperature match the refrigeration capacities available then two stages could be enough. This could be true for some applications if the coil temperature requirements are around 40–50 K and the first stage of the refrigerator can cool the probe electronics/sample. However, for NMR, if the coil temperature requirement is around 20–30 K then an additional, intermediate stage, at 15–20 K would be needed for cooling the coolant path. A three (or more) stage refrigerator allows more flexibility in the applications with which the assembly can be used e.g. MRI, NMR and FTICR, when the temperature requirement of the probe can differ. A 2 stage refrigerator cannot do that as its 2 stage temperatures are fixed—one for radiation shield and the other for recondensing, unless the shield and coil temperature match. This technology could also be used in conjunction with other measurement devices requiring low temperatures such as those for material characterisation.

Typically, one or more stages of the refrigerator will be coupled to a corresponding number of heat shields of the cryostat, for example to 45–50 K. The coolant path may be coupled to one or more of the cooling stages also. In some cases, one of the cooling stages of the refrigerator may be used solely for cooling the coolant path while the other(s) is used for cooling the cryostat.

Some examples of magnetic field generating assemblies according to the invention will now be described with reference to the accompanying drawings, in which.

Figure 1:
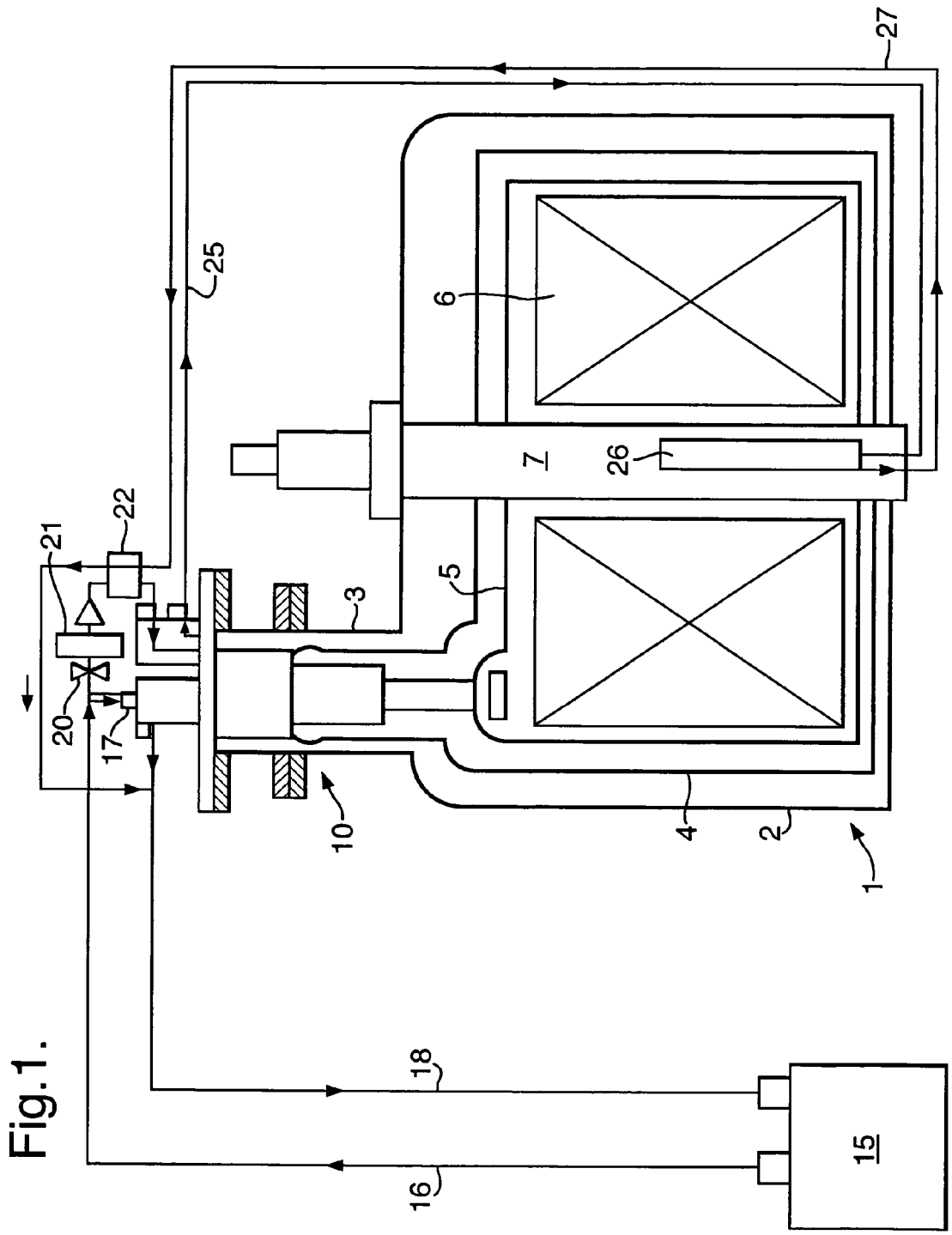
FIG. 1 is a schematic diagram of a first example.

The example shown in FIG. 1 comprises a cryostat 1 defined by an outer vacuum chamber 2 with an upwardly extending neck 3. Within the chamber 2 is located a cooled shield 4 surrounding a liquid helium vessel 5 in which is located a superconducting magnet 6. The magnet 6 surrounds a bore 7 which is located outside the cryostat at room temperature.

In order to cool the cryostat 1, a cryocooler in the form of three stage pulse tube refrigerator (PTR) 10 (not shown) is mounted within a three stage sack in the neck 3 of the cryostat. The structure of the PTR 10 is shown in more detail in FIG. 3.

Figure 3:
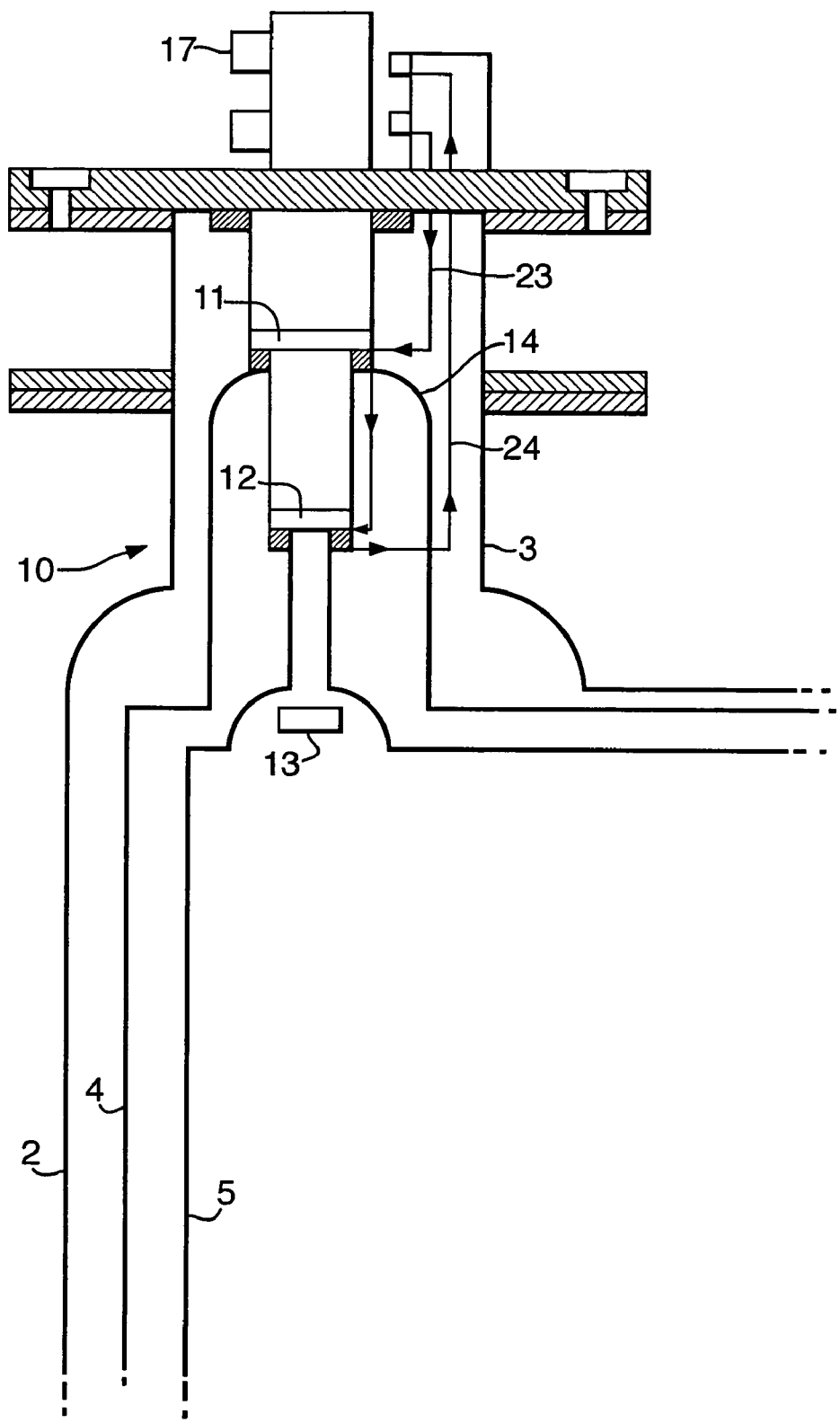
FIG. 3 illustrates the mounting arrangement of the refrigerator in more detail for either of the FIGS. 1 and 2 examples.

As can be seen more clearly in FIG. 3, the three stages of the refrigerator 10 are indicated at 11–13. The first stage 11 is held at a temperature of about 50 K, the second stage at a temperature in the range 20–25 K, and the third stage at a temperature of about 4.2 K.

The first stage 11 is coupled via flexible braid connections 14 to the shield 4 so as to hold the temperature of the shield at about 50 K.

The third stage 13 is located in the liquid helium vessel 5 and will re-condense evaporating helium.

The PTR 10 is connected to a gas compressor 15 which supplies compressed gas typically Helium although other gases such as argon, nitrogen, xenon etc. could be used, along a supply line 16 to a high pressure inlet 17 of the PTR 10. This compressed gas is used to cool the stages 11–13 in a conventional manner and gas then returns along a return line 18 to the compressor 15. A suitable PTR is described in "Novel configuration of three-stage pulse tube refrigerator for temperatures below 4 K", Matsubara et al, Cryogenics 1994, Vol. 34, No. 4, pages 259–262. Alternative refrigerators which could be used are Stirling, Gifford-McMahon and Joule-Thomson refrigerators.

In this example, a small proportion of the compressed gas from the supply line 16 is tapped off via a valve 20 and fed via a gas purifier 21 to a heat exchanger 22. The heat exchanger 22 pre-cools the incoming compressed gas (as explained below) which is then supplied into the neck 3 of the cryostat as can be seen more clearly in FIG. 3. This gas passes along a conduit 23 until it reaches the first stage 11 of the PTR 10 and then is fed on to the second stage 12 before returning along a conduit 24. The gas has thus been cooled to 20–25 K. The gas is then supplied along a conduit 25 to a probe 26. The probe 26 carries typically a sample and/or RF and/or gradient coils and can be removably inserted into the bore 7 as shown. The cooled gas in the conduit 25 is thus used to cool the components and/or sample on or in the probe 26 and then returns along a return line 27 to the heat exchanger 22 where it assists in pre-cooling the incoming compressed gas. The returning gas is then returned to the return line 18 coupled to the compressor 15.

The conduit 25 and return line 27 in the form of capillaries are provided in a convoluted copper sleeve (not shown) and this in turn is located in a flexible stainless steel pipe (also not shown).

Within the probe 26, the cooling system will consist of small capillary tubes (not shown) and thus it is important to provide the gas purifier 21 to prevent contamination or moisture in the gas which could block the capillary tubes and thus stop the flow.

Figure 2:
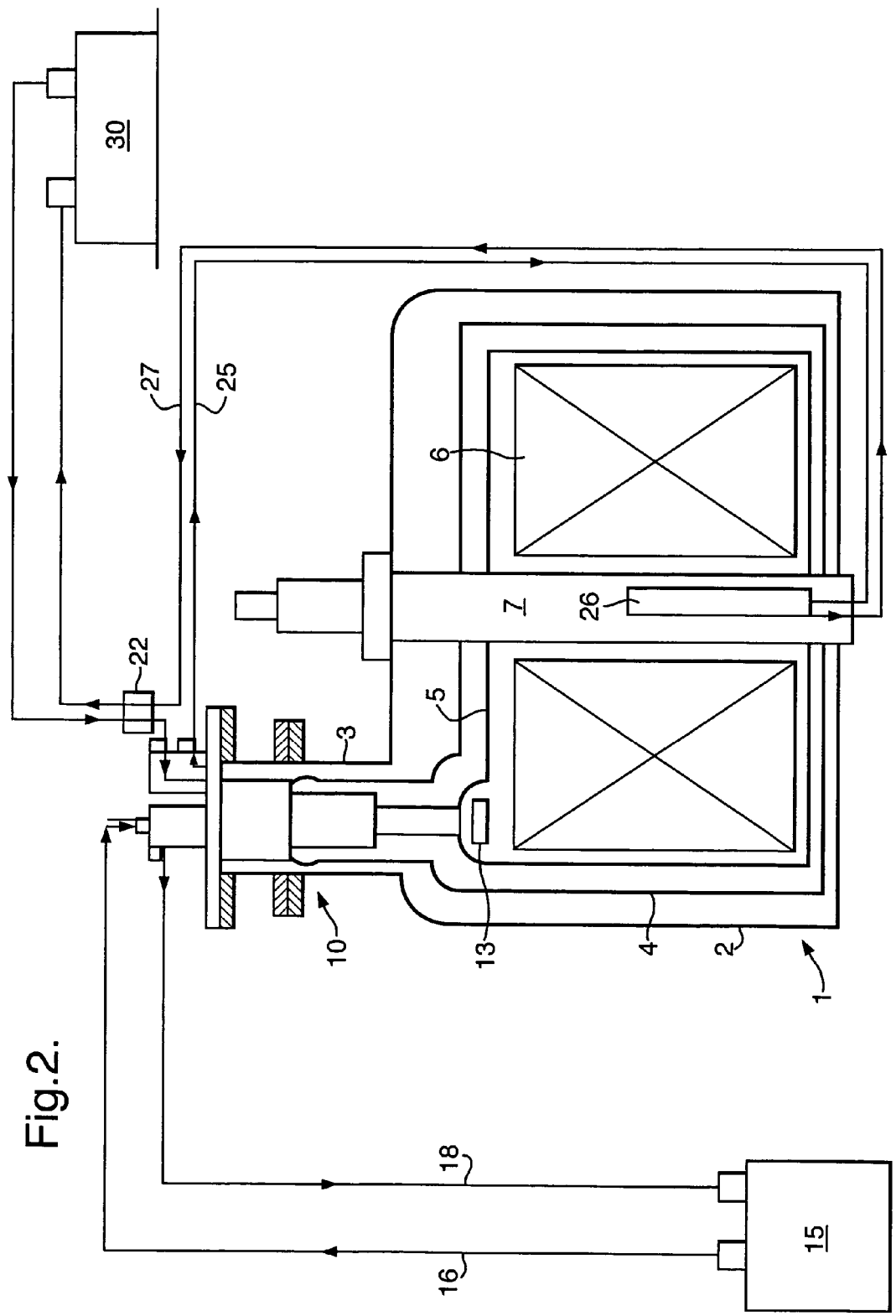
FIG. 2 is a schematic diagram of a second example.

An alternative approach to avoiding this problem is shown in FIG. 2. The structure of FIG. 2 is the same as that shown in FIG. 1 except that the coolant circuit to the probe 26 is completely separate from the compressed gas circuit of the PTR 10. A further dry compressor or pump 30 is provided coupled to the supply and return lines 25,27 of the coolant path to the probe 26.

I claim:

1. A magnetic field generating assembly comprising a superconducting magnet located in a cryostat and defining a bore accessible from outside the cryostat; and a mechanical refrigerator having at least two cooling stages for at least partly cooling the cryostat; and a coolant path extending from the refrigerator into the magnet bore, the coolant path being coupled for heat exchange with a cooling stage of the refrigerator other than the coldest cooling stage so that the refrigerator is adapted also to cool coolant in the coolant path.

2. An assembly according to claim 1, wherein the bore supports one or more components which are coupled to the coolant path.

3. An assembly according to claim 1, further comprising a probe adapted to be removably inserted into the bore, the probe carrying in use one or more components and/or a sample and being coupled to the coolant path such that the coolant path cools the component(s) and/or samples in use.

4. An assembly according to claim 3, wherein the coolant path is defined at least partially by a flexible conduit.

5. An assembly according to claim 2, wherein the or each component comprises one or more of RF and gradient coils.

6. An assembly according to claim 1, wherein the cryostat includes a number of heat shields, the refrigerator being coupled to one or more of the heat shields.

7. An assembly according to claim 1, wherein the refrigerator has three cooling stages.

8. An assembly according to claim 7, wherein the coolant path is coupled to an intermediate cooling stage of the refrigerator.

9. An assembly according to claim 8, wherein the coolant path is coupled with two cooling stages of the refrigerator, excluding the coldest cooling stage.

10. An assembly according to claim 7, wherein the coldest, third stage is located in a coolant containing vessel so as to re-condense evaporating coolant in the vessel, such as He.

11. An assembly according to claim 10, wherein the coolant containing vessel also contains the superconducting magnet.

12. An assembly according to claim 1, wherein the coolant path is coupled with a single cooling stage of the refrigerator.

13. An assembly according to claim 12, wherein the cryostat is cooled by the remaining cooling stage or stages of the refrigerator.

14. An assembly according to claim 1, further comprising a gas compressor for supplying compressed gas to the refrigerator for use in cooling each stage, and means for supplying a portion of the compressed gas to the coolant path.

15. An assembly according to claim 14, further comprising a gas purifier through which compressed gas is supplied to the coolant path.

16. An assembly according to claim 1, further comprising a first gas compressor for supplying compressed coolant gas to the refrigerator for use in cooling each stage; and a second gas compressor or pump for supplying a coolant gas to the coolant path.

17. An assembly according to claim 1, wherein the coolant path comprises a supply line and a return line, the assembly further comprising a heat exchanger coupling the supply and return lines at a location such that coolant in the supply line is precooled prior to reaching the refrigerator.

18. An assembly according to claim 1, wherein the refrigerator comprises a pulse tube refrigerator.

* * * * *